(12) United States Patent
Gong et al.

(10) Patent No.: US 8,692,599 B2
(45) Date of Patent: Apr. 8, 2014

(54) INTERPOLATIVE DIVIDER LINEARITY ENHANCEMENT TECHNIQUES

(75) Inventors: Xue-Mei Gong, Austin, TX (US); Adam B. Eldredge, Austin, TX (US); Susumu Hara, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/592,160

(22) Filed: Aug. 22, 2012

(65) Prior Publication Data

US 2014/0055179 A1    Feb. 27, 2014

(51) Int. Cl.
*H03L 7/06*    (2006.01)
(52) U.S. Cl.
USPC ............................. 327/159; 375/376; 327/156
(58) Field of Classification Search
USPC .......... 327/156–159, 231–260; 375/373–376, 375/294; 331/1 R–34
See application file for complete search history.

(56) References Cited

U.S. PATENT DOCUMENTS

| | | | |
|---|---|---|---|
| 4,009,450 A * | 2/1977 | Holcomb et al. | 331/17 |
| 7,298,790 B2 * | 11/2007 | Craninckx | 375/294 |
| 7,417,510 B2 | 8/2008 | Huang | |
| 7,800,451 B2 * | 9/2010 | Fu et al. | 331/4 |
| 2004/0263225 A1 * | 12/2004 | Perrott et al. | 327/156 |

OTHER PUBLICATIONS

U.S. Appl. No. 13/469,936, filed May 11, 2012, entitled "Higher-Order Phase Noise Modulator to Reduce Spurs and Quantization Noise," naming Adam B. Eldredge and Xue-Mei Gong as inventors.
U.S. Appl. No. 13/242,803, filed Sep. 23, 2011, entitled "Sigma-Delta Modulation with Reduction of Spurs Using a Dither Signal," naming Adam B. Eldredge as inventor.

* cited by examiner

*Primary Examiner* — Lincoln Donovan
*Assistant Examiner* — Thomas Skibinski
(74) *Attorney, Agent, or Firm* — Abel Law Group, LLP (57) ABSTRACT

A flexible clock synthesizer technique includes generating a phase interpolator calibration signal to adjust a phase interpolator output signal generated by a phase interpolator of an interpolative divider. The phase interpolator is responsive to a phase interpolator control code and an output signal of a fractional-N divider of the interpolative divider. The phase interpolator calibration signal is based on an error signal indicative of a phase interpolator error. The error signal may indicate a phase relationship between a reference clock signal and a feedback clock signal of a PLL. The interpolative divider may be coupled in a feedback path of the PLL. The PLL may receive a reference clock signal and the feedback clock signal may be an adjusted phase interpolator output signal. The phase interpolator calibration signal may be a phase interpolator offset code corresponding to the phase interpolator control code or a phase interpolator gain signal.

29 Claims, 11 Drawing Sheets

INTERPOLATIVE DIVIDER LINEARITY ENHANCEMENT TECHNIQUES

BACKGROUND

1. Field of the Invention

This invention relates to generating clock signals for electronic devices.

2. Description of the Related Art

Figure 1A:
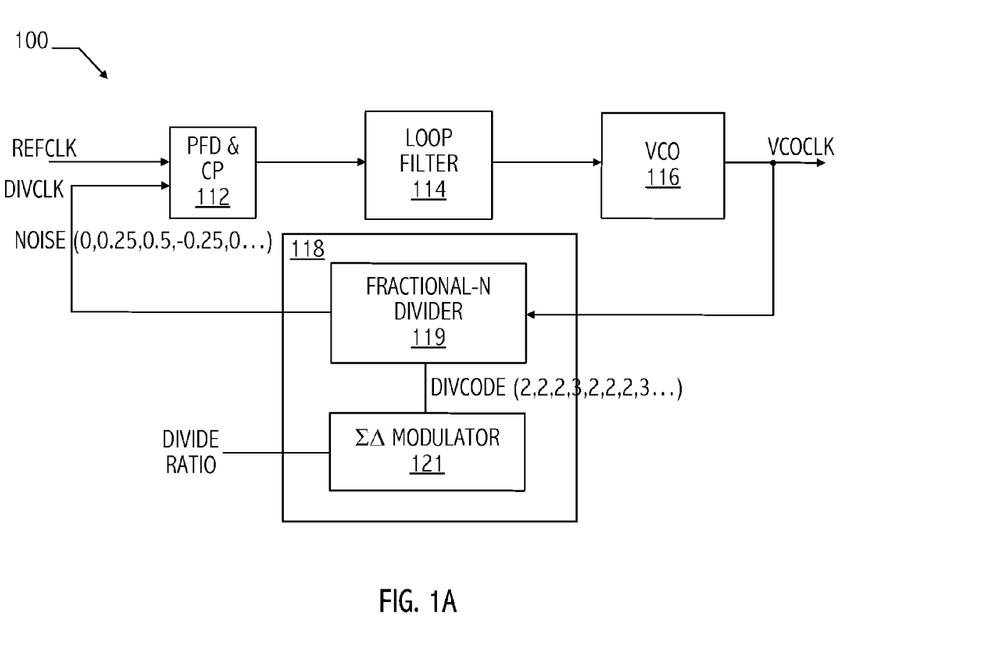
FIG. 1A illustrates a functional block diagram of an exemplary clock synthesizer phase-locked loop (PLL) including a fractional-N frequency divider.

Clock synthesizers generate clock signals utilized by a wide variety of electronic products. Referring to FIG. 1A, a typical clock synthesizer utilizes a phase-locked loop (PLL) supplied with a reference signal from a source such as a crystal oscillator. The output frequency of the signal supplied by the synthesizer can be determined by a divider value of the feedback divider in the PLL. Thus, a reference frequency supplied to the PLL is multiplied based on the divider value to generate the synthesized clock frequency. For example, feedback divider 118 of PLL 100 may include a fractional-N feedback divider 119. In at least one embodiment, DIVIDE RATIO is a digital frequency ratio translated from a code, e.g., a code provided by non-volatile memory (NVM). Sigma-delta modulator 121 supplies a divide sequence to fractional-N feedback divider 119. Fractional-N divider 119 receives the divide value sequence corresponding to the target divider ratio.

Figure 1B:
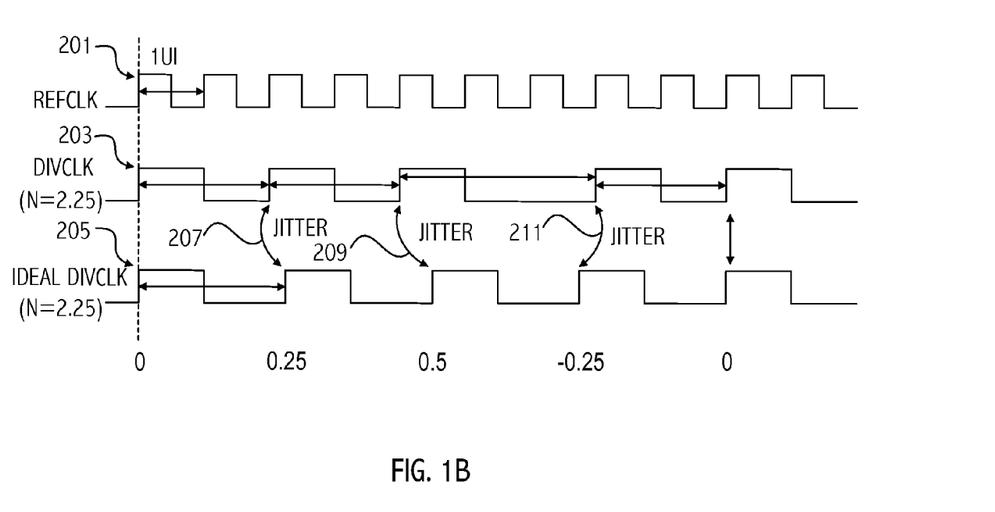
FIG. 1B illustrates exemplary timing waveforms for the clock synthesizer PLL of FIG. 2A.

FIG. 1B illustrates a timing diagram of a divide by 2.25. The input clock (REFCLK) is shown as waveform 201, having a period of one unit interval (UI). The output of the fractional-N divider, DIVCLK, is shown in waveform 203. As shown in waveform 203, the divide ratio of 2.25 is achieved by a sequence of divide by 2 for three periods and a divide by 3 for one period, assuming a first order sigma-delta modulator is used to control the fractional-N divider. Waveform 205 illustrates the ideal waveform for a divide ratio of 2.25. The quantization noise of the modulator, at the output of divider 118 of FIG. 1A, is shown as the difference at 207, 209, and 211 of FIG. 1B, between the actual output of the fractional-N divider shown in waveform 203 and the ideal output for a divide by 2.25 shown in waveform 205.

Referring back to FIG. 1A, fractional-N divider 119 supplies the divided signal to phase/frequency detector 112 with noise associated with the nature of the fractional-N divider. In fractional-N synthesis, the fractional-N noise may be filtered out by the PLL loop. In addition, phase error correction may be utilized to address the jitter introduced by the divider by introducing an offset into the PLL corresponding to the jitter generated by the fractional-N divider. However, such clock synthesizers may require a complex loop filter and complex voltage-controlled oscillator control that increase the cost in design effort and chip area, resulting in more expensive products that may be too expensive in cost or real estate for significant portions of the clock synthesizer market. Accordingly, low-cost, low-noise, flexible clock synthesizer techniques are desired.

SUMMARY OF EMBODIMENTS OF THE INVENTION

A flexible clock synthesizer technique uses an interpolative divider that includes a fractional-N divider and a phase interpolator. In at least one embodiment of the invention, a method includes generating a phase interpolator calibration signal to adjust a phase interpolator output signal generated by the phase interpolator of the interpolative divider. The phase interpolator is responsive to a phase interpolator control code and an output signal of the fractional-N divider of the interpolative divider. The phase interpolator calibration signal is based on an error signal indicative of a phase interpolator error. The method may include generating the error signal based on a phase relationship between a reference clock signal and a feedback clock signal of a PLL. The interpolative divider may be coupled in a feedback path of the PLL. The PLL may receive the reference clock signal, and the feedback clock signal may be an adjusted phase interpolator output signal. A PLL may receive an adjusted phase interpolator output signal as the feedback clock signal, and the reference clock signal may be generated by a voltage controlled oscillator of the PLL. The phase interpolator calibration signal may be a phase interpolator offset code corresponding to the phase interpolator control code. The phase interpolator calibration signal may be a phase interpolator gain signal. The method may include configuring the phase interpolator calibration signal to be a gain signal or a phase interpolator offset signal corresponding to a phase interpolator control signal.

In at least one embodiment of the invention, an integrated circuit includes an interpolative divider circuit configured to generate an adjusted clock signal based on a clock signal, a divide control signal, a phase interpolator control signal, and a phase interpolator calibration signal. The integrated circuit includes a calibration circuit configured to generate the phase interpolator calibration signal based on an error signal indicative of a phase interpolator error. The error signal may indicate a phase relationship between a reference clock signal and a feedback signal of a PLL. The phase interpolator calibration signal may be a phase interpolator gain signal. The phase interpolator calibration signal may be a phase interpolator offset signal corresponding to the phase interpolator control signal. The integrated circuit may include dynamic element matching logic configured to generate the phase interpolator control signal based on a phase interpolator control code. The PLL may include the interpolative divider circuit configured to generate the feedback signal of the PLL. The integrated circuit may include a PLL configured to provide the clock signal to the interpolative divider circuit. The interpolative divider circuit may be coupled in an output path of a clock synthesizer circuit to generate the adjusted clock signal based on a first divider control value. The integrated circuit may include an additional interpolative divider circuit coupled in an additional output path of the clock synthesizer circuit and configured to generate an additional adjusted clock signal based on the clock signal and a second divider control value. The calibration circuit may include a storage module configured to store a plurality of phase interpolator offsets corresponding to a plurality of respective phase interpolator codes. The calibration circuit may include a summing circuit configured to generate an updated phase interpolator offset code based on the phase interpolator offset code. The phase interpolator offset code may be based on the error signal. The calibration circuit may include a gear-shifting circuit configured to adjust a step size for generating an updated phase interpolator offset code at a predetermined time after power-on-reset of the integrated circuit. The calibration circuit may include a phase detector offset generator configured to provide, to a PLL generating the error signal, a phase detector offset code based on the error signal.

BRIEF DESCRIPTION OF THE DRAWINGS

The present invention may be better understood by, and its numerous objects, features, and advantages made apparent to, those skilled in the art by referencing the accompanying drawings.

The use of the same reference symbols in different drawings indicates similar or identical items.

DETAILED DESCRIPTION

Figure 2:
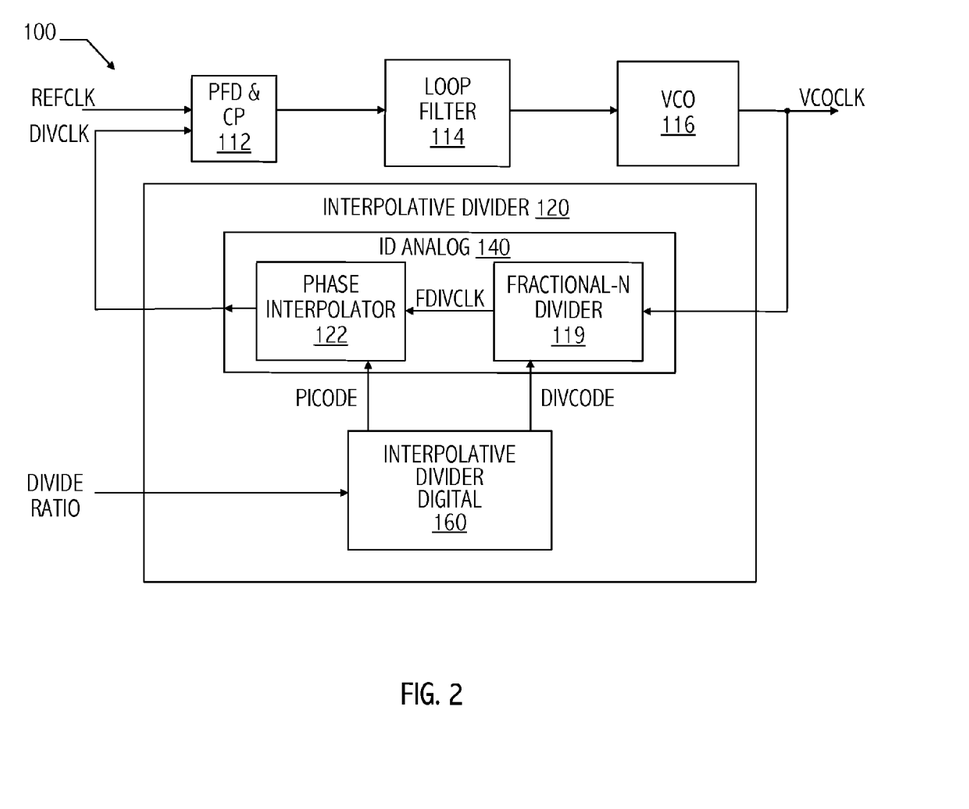
FIG. 2 illustrates a functional block diagram of an exemplary clock synthesizer PLL including an interpolative divider.

FIG. 2 illustrates an exemplary architecture of a clock synthesizer phase-locked loop (PLL). Phase-locked loop 100 includes a phase/frequency detector 112, a loop filter 114, and a voltage-controlled oscillator (VCO) 116. Voltage controlled oscillator 116 may be implemented as a ring oscillator, an LC oscillator, or other suitable oscillator structure. Phase/frequency detector 112 receives a reference clock signal, REFCLK, which can be provided by a fixed source such as a crystal oscillator, a microelectromechanical structure (MEMS) oscillator, or other suitable source. Fractional-N divider 119 introduces a digital quantization error that causes phase noise (i.e., jitter) in the feedback clock signal FDIVCLK. For example, FDIVCLK may have jitter of up to one VCO clock cycle.

A technique for reducing jitter in PLL 100 includes adjusting the phase of the frequency-divided signal according to a phase error control signal, PICODE, generated by interpolative divider 120, which is in the feedback path of PLL 100. Interpolative divider techniques for reducing noise associated with a fractional-N divider are described in U.S. Pat. No. 7,417,510, filed Oct. 17, 2006, entitled "Direct Digital Interpolative Synthesis," naming Yunteng Huang as inventor, which application is hereby incorporated by reference. Interpolative divider 120 includes analog module 140 that includes phase interpolator 122 and fractional-N divider 119. Phase interpolator 122 adjusts the phase of FDIVCLK according to the digital quantization error to reduce error in DIVCLK, thereby introducing a phase adjustment prior to phase/frequency detector 112 of PLL 100. Interpolative divider 120 includes a digital module 160, which may include a typical first-order sigma-delta modulator. Digital module 160 generates the DIVCODE for fractional-N divider 119. In addition, digital module 160 generates the PICODE and supplies it to phase interpolator 122. Phase interpolator 122 interpolates between the frequency-divided signal and one or more delayed versions of the frequency-divided signal (one or more equally-spaced phases of the frequency-divided signal) based on the PICODE, which corresponds to the phase error, using techniques that are well known in the art.

Figure 12A:
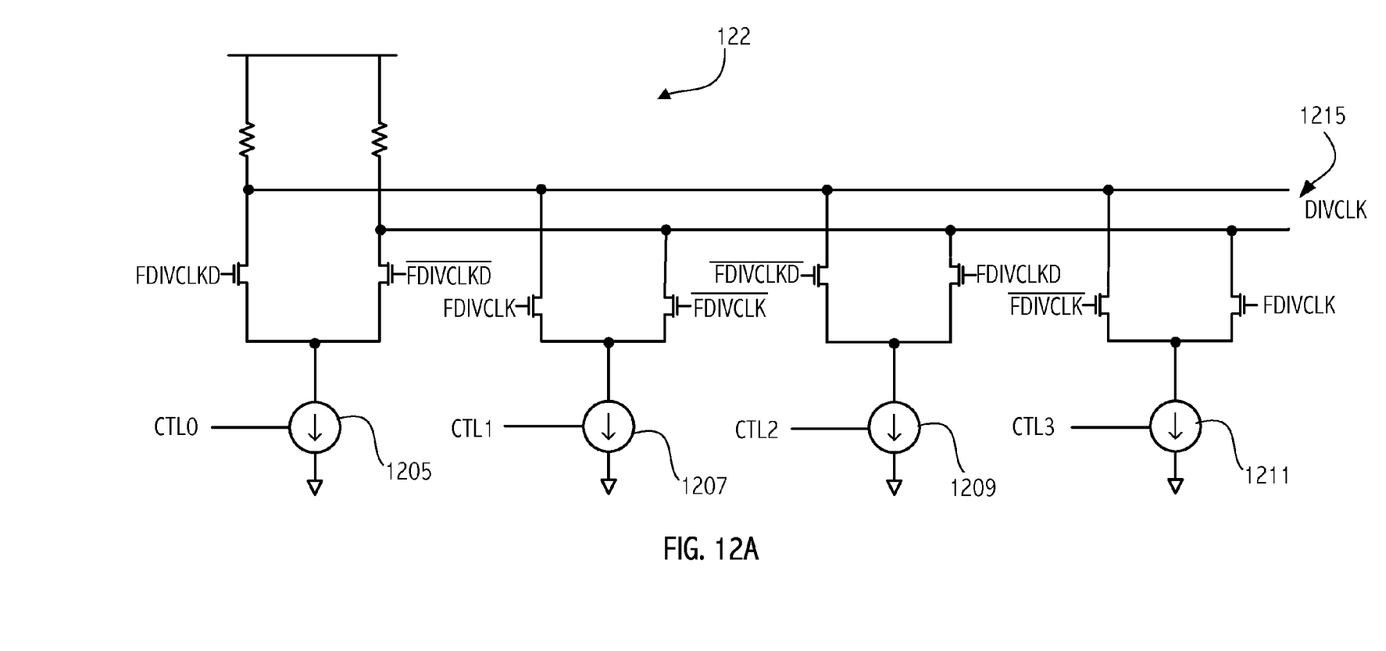
FIG. 12A illustrates an embodiment of a phase interpolator that may be used by an interpolative divider.
Figure 12B:
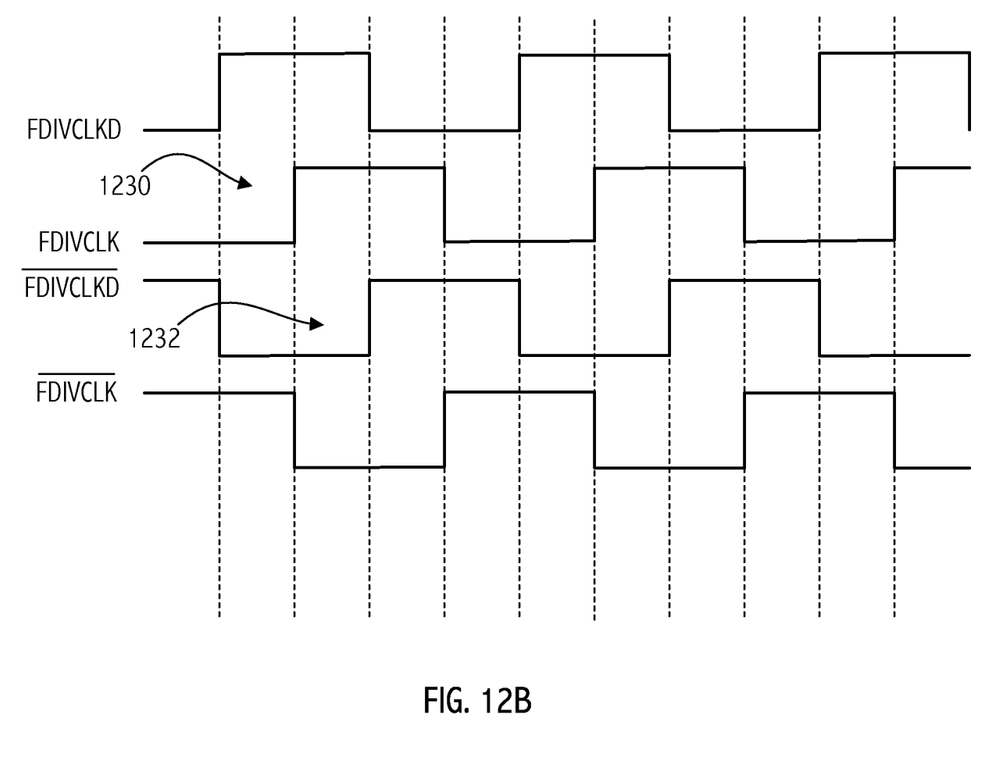
FIG. 12B illustrates a timing diagram of exemplary phases supplied to the phase interpolator of FIG. 12A.

For example, phase interpolator 122 generates multiple equally-spaced phases of FDIVCLK and interpolates appropriate ones of those phases to generate DIVCLK. An exemplary phase interpolator 122 is shown in FIG. 12A. FDIVCLK and its complement, $\overline{FDIVCLK}$, and versions of those signals delayed by one-half the clock period of VCO 116, FDIVCLKD and $\overline{FDIVCLKD}$, respectively, are used by interpolator 122. FIG. 12B illustrates exemplary waveforms for FDIVCLK, $\overline{FDIVCLK}$, FDIVCLKD, and $\overline{FDIVCLKD}$. Note that while FDIVCLK is illustrated in other figures as a single-ended signal for ease of understanding, differential signaling and differential circuits may be used. In the embodiment in FIG. 12A, four current sources 1205, 1207, 1209, and 1211 are coupled to determine the interpolated differential output clock signal DIVCLK supplied on nodes 1215. The digital quantization error is used to control the operation of the current sources 1205, 1207, 1209, and 1211.

Assume, for example, the digital quantization error of the sigma-delta modulator is eight bits. Two bits may be used to select which of the current sources shown in FIG. 12A are enabled. With two bits, up to four different pairs of current sources can be selected. For example, referring to FIG. 12A and FIG. 12B, if the quantization error indicates that the properly interpolated waveform should be in region 1230, then the interpolator utilizes FDIVCLK and FDIVCLKD and selects current sources 1205 and 1207 to be used for the interpolation. Similarly, if the quantization error indicates the properly interpolated waveform should be in region 1232, then the interpolator can utilize current sources 1207 and 1209 to interpolate between FDIVCLKD and $\overline{FDIVCLK}$. Similarly, other appropriate pairs of current sources can be used by the interpolator based on the quantization error. Assuming that two bits of the eight-bit quantization error are used to select the current source pairs, the remaining six bits may be used to generate appropriate control values for CTL0, CTL1, CTL2, and CTL3 to provide appropriate digital-to-analog conversion (DAC) control, i.e., the strength of the current, for the various current sources based on the digital quantization error. Such techniques are well known in the art. Other interpolator implementations may be used based on such factors as the accuracy required, power considerations, design complexity, chip area available, and the number of bits used to represent the digital quantization error. Referring back to FIG. 2, interpolative divider 120 provides the output of phase interpolator 122 to phase/frequency detector 112.

Figure 3:
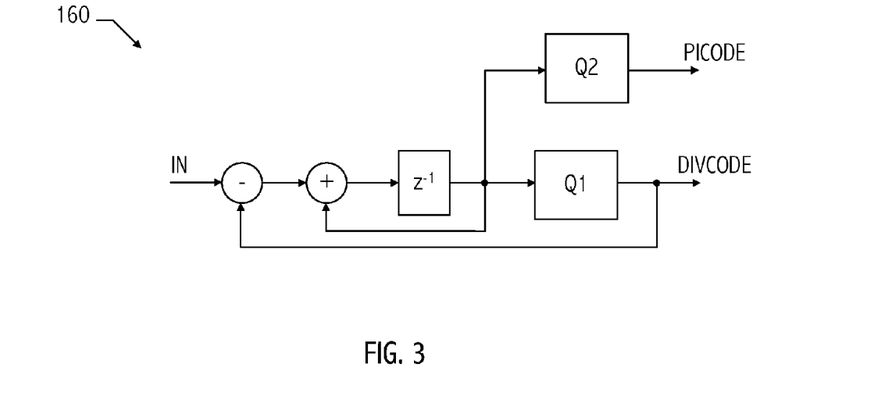
FIG. 3 illustrates a functional block diagram of an exemplary digital modulator module of the interpolative divider of FIG. 2.

Referring to FIGS. 2 and 3, digital module 160 may include a first-order sigma-delta modulator that is implemented in digital circuitry (e.g., using digital delay elements, adders, comparators, etc.). Digital module 160 generates both the PICODE and the DIVCODE. The DIVCODE may be a truncated version (i.e., integer portion) of the integrator output signal, and the PICODE (which corresponds to the digital quantization error) is the truncated portion (i.e., fractional portion) of the integrator output signal. In at least one embodiment of PLL 100, DIVCODE is a code having a range of integer values n≤DIVCODE≤n+1, and the PICODE is an eight-bit code, having a range of values of $0 \le PICODE \le (2^8-1)$. Referring back to FIG. 2, phase interpolator 122 delays the signal received from fractional-N divider 119 according to the PICODE to reduce or eliminate phase error before phase/frequency detector 112, thereby reducing the noise in DIVCLK, which allows the PLL loop bandwidth to be wider and reduces contributions of VCO noise to the output clock signal. The reduction in phase error also allows reduction in current of the charge pump that converts the output of phase/frequency detector 112 into a current, thereby reducing phase noise. In addition, the reduction in phase error reduces the linearity requirements on phase/frequency detector 112. Linearity and gain error of phase interpolator 122 introduces spurs into DIVCLK.

Rather than implement digital module 160 using a single first-order sigma-delta modulator that generates both the DIVCODE and the PICODE, as illustrated in FIG. 3, a technique for reducing spurs and quantization noise in PLL 100 includes generating the DIVCODE and the PICODE using a frequency modulator and a separate phase modulator (e.g., frequency modulator 161 and phase modulator 163 of FIG. 6), which may include a higher-order modulator having a wideband signal transfer function. Techniques for reducing spurs in the feedback signal generated by an interpolative divider resulting from the DIVCODE and PICODE are described in U.S. patent application Ser. No. 13/469,936, filed May 11, 2012, entitled "Higher-Order Phase Noise Modulator to Reduce Spurs and Quantization Noise," naming Adam B. Eldredge and Xue-Mei Gong as inventors, which application is hereby incorporated by reference.

Figure 4A:
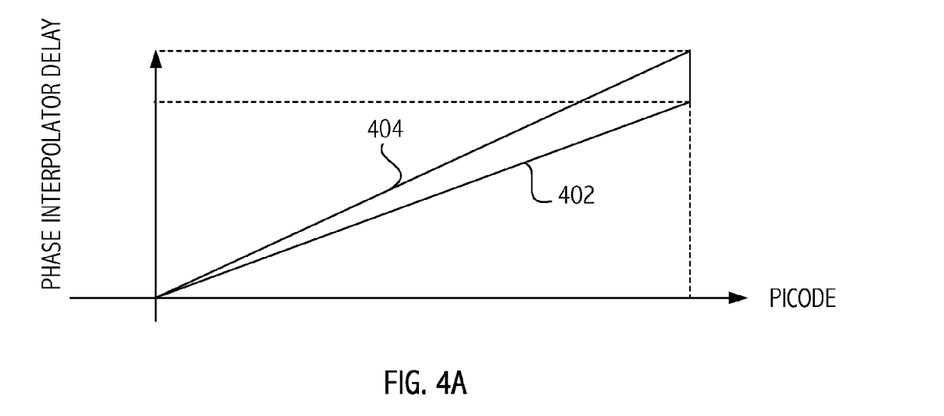
FIG. 4A illustrates exemplary gain error for phase interpolator delay as a function of phase interpolator code for the PLL of FIG. 2.
Figure 4B:
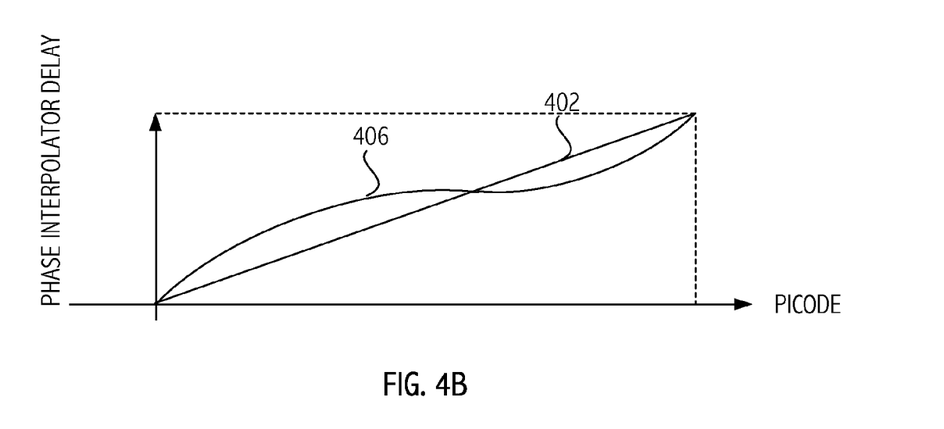
FIG. 4B illustrates exemplary sinusoidal error for phase interpolator delay as a function of phase interpolator code for the PLL of FIG. 2.
Figure 4C:
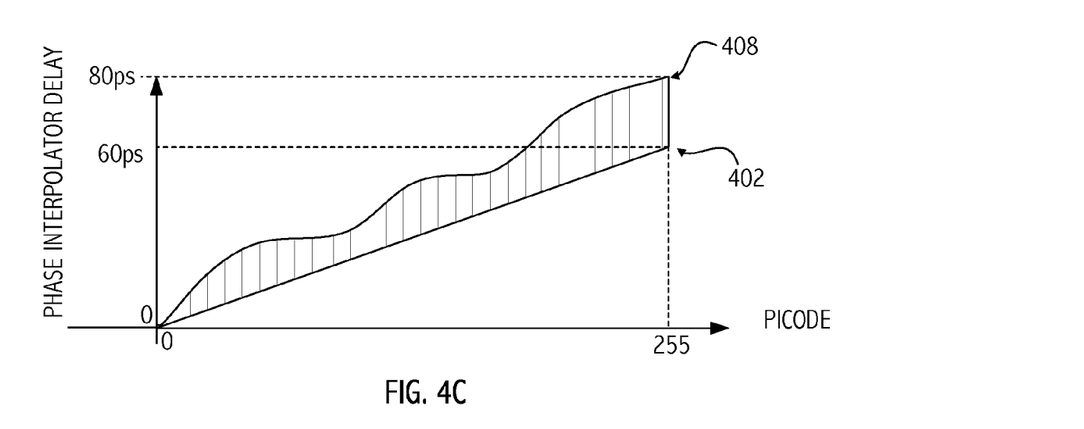
FIG. 4C illustrates exemplary non-linear error for phase interpolator delay as a function of phase interpolator code for the PLL of FIG. 2.

Referring back to FIG. 2, phase interpolator 122 delays the output signal of fractional-N divider 119 according to the value of PICODE. For example, PICODE may have F bits (e.g., F=8), corresponding to $P=2^F$ (e.g., 256) different $PICODE_i$ (e.g., $0 \le i \le P-1$), which correspond to P different delay values. A maximum delay is introduced by a PICODE (e.g., $PICODE_{P-1}$) corresponding to a target maximum delay of almost one VCO cycle (e.g., a delay of 255/256×a period of one VCO cycle). The target delay increment (i.e., a delay difference between consecutive PICODES, e.g., the delay difference between $PICODE_i$ and $PICODE_{i+1}$, where $0 \le PICODE_i \le PICODE_{P-1}$) is one VCO cycle divided by P. Performance of the PLL degrades if an actual delay resulting from a PICODE-to-delay conversion does not correspond to the target delay for the PICODE-to-delay conversion. For example, referring to FIG. 4A, the delay introduced by phase interpolator 122 may have a gain error that incrementally increases more (or less) than a target incremental increase (i.e., the slope of the actual PICODE-to-delay conversion curve 404 does not equal a slope of target conversion curve 402). The delay introduced by phase interpolator 122 may result in the actual PICODE-to-delay conversion curve having a more complex function, e.g., a sinusoidal error function (actual PICODE-to-delay conversion curve 406 of FIG. 4B) or an even more complex non-linear error function (actual PICODE-to-delay conversion curve 408 of FIG. 4C). Accordingly, PLL 100 implements a calibration technique to increase linearity of the PICODE-to-delay conversion of phase interpolator 122 and reduce spurs in DIVCLK.

Figure 5:
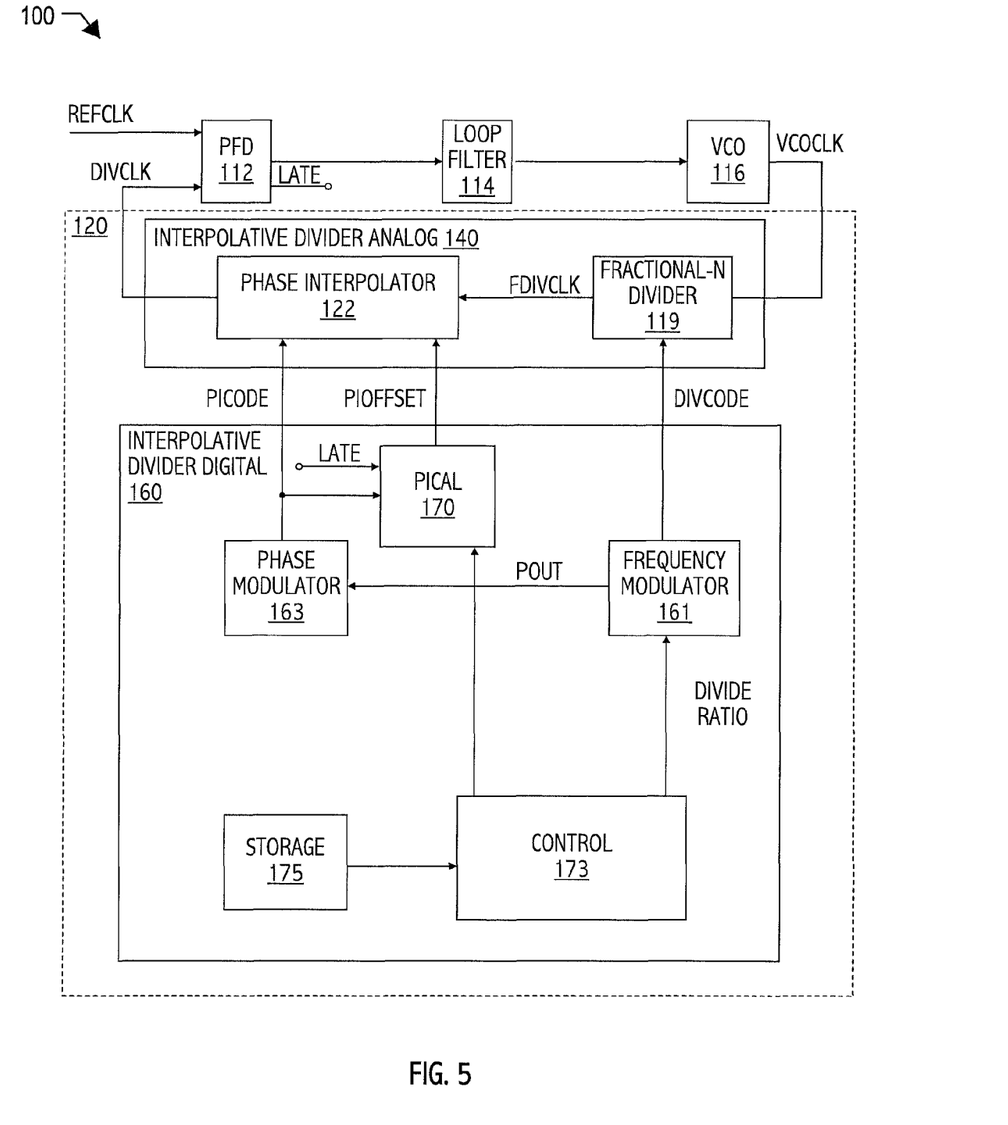
FIG. 5 illustrates a functional block diagram of a clock synthesizer PLL including an interpolative divider with a calibration module consistent with at least one embodiment of the invention.

Referring to FIG. 5, PLL 100 includes phase interpolator calibration logic, PICAL 170. In at least one embodiment, PICAL 170 provides a phase interpolator calibration signal (e.g., phase interpolator offset value, PIOFFSET) to phase interpolator 122. The value of PIOFFSET indicates a delay offset that corresponds to the delay indicated by the value of the PICODE. Phase interpolator 122 uses that delay offset indicated by the PIOFFSET value to improve the linearity of the PICODE-to-delay conversion. Note that as referred to herein, PICODE is a current phase interpolator code provided by modulator 160 to phase interpolator 122 and has one of P values, i.e., PICODE has a value $PICODE_i$, where $0 \le i \le P-1$. Similarly, as referred to herein, PIOFFSET is a current delay offset code that corresponds to the current phase interpolator code and has one of P values, i.e., PIOFFSET has a value $PIOFFSET_i$, where $0 \le i \le P-1$. In at least one embodiment, phase interpolator 122 generates a combined delay value based on PICODE and PIOFFSET and adjusts the phase of the frequency-divided output signal received from fractional-N divider 119, FDIVCLK, based on that combined delay value to generate DIVCLK. In other embodiments, phase interpolator 122 performs a two-stage adjustment (e.g., includes two delay modules) that adjusts the phase of FDIVCLK by the delay indicated by PICODE (PIOFFSET) to generate a first adjusted signal and then adjusts that first adjusted signal based on the delay indicated by PIOFFSET (PICODE).

Figure 6:
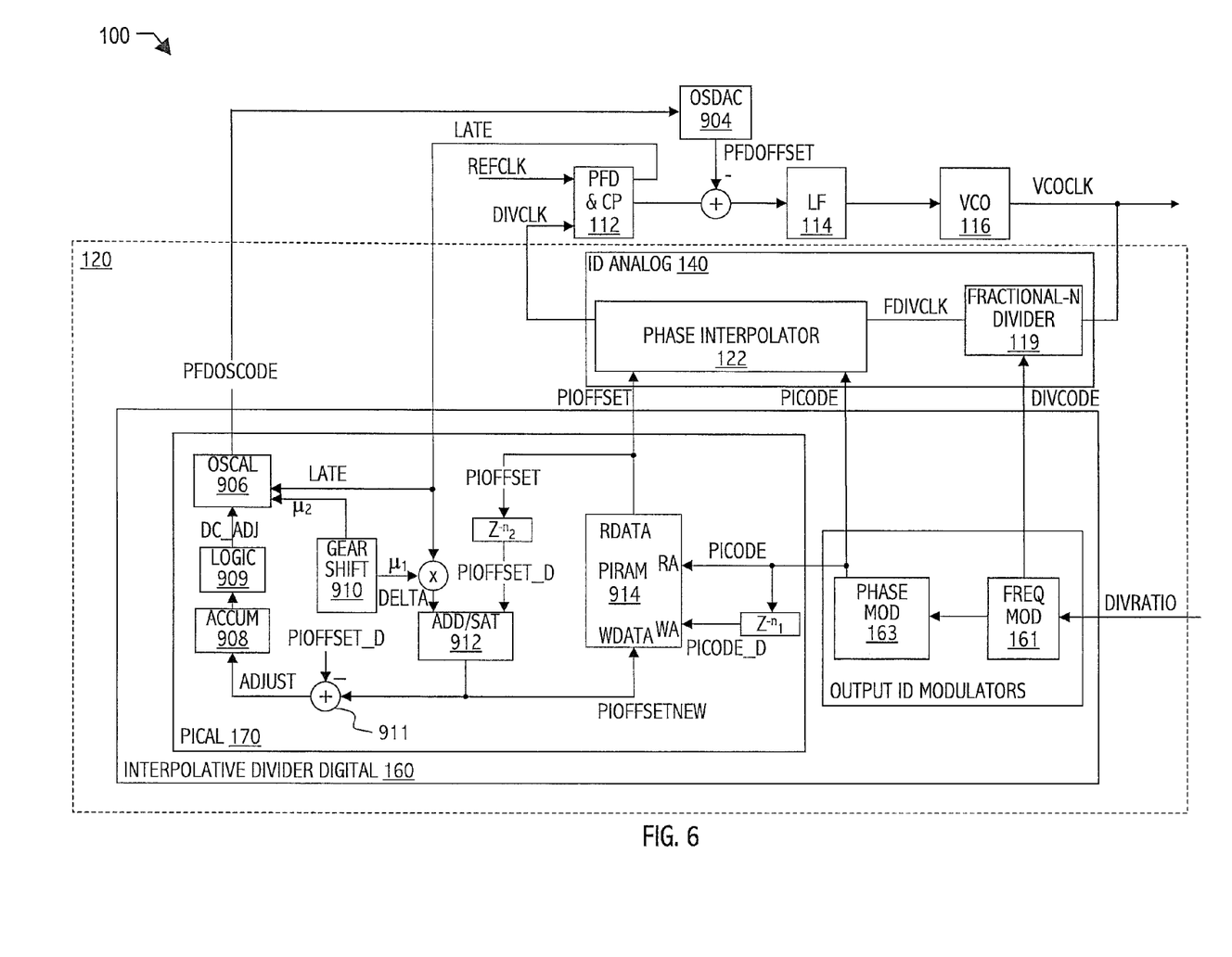
FIG. 6 illustrates a detailed, functional block diagram of portions of the clock synthesizer PLL of FIG. 5, including an interpolative divider with a digital calibration module configured to generate a phase interpolator offset signal consistent with at least one embodiment of the invention.

Referring to FIG. 6, phase interpolator calibration circuitry 170 provides PIOFFSET based on the output of phase modulator 163, PICODE, which indicates a value of PICODE provided to phase interpolator 122. Phase interpolator calibration circuitry 170 uses PICODE to index a corresponding entry in a random access memory or other storage device, PIRAM 914. PIRAM 914 provides that stored offset, PIOFFSET, to phase interpolator 122 concurrently with the corresponding PICODE.

In addition, phase interpolator calibration circuitry 170 generates and updates individual values of PIOFFSET that are stored in PIRAM 914 based on an error signal, LATE, which indicates an error associated with the phase interpolator. The error signal is generated based on a phase relationship between a reference clock signal and a feedback clock signal of a PLL. For example, LATE has a value of +1 if DIVCLK lags REFCLK and LATE has a value of −1 if DIVCLK leads REFCLK. In at least one embodiment of the calibration technique, PICAL 170 determines a delay offset code $PIOFFSET_i$ for each corresponding $PICODE_i$. PICAL 170 may determine initial $PIOFFSET_i$ values during an acquisition interval of operation of PLL 100 that is triggered by power-on-reset or other initialization indicator. For example, during initialization, a state machine or other control circuitry causes PICAL 170 to clear the contents of PIRAM 914 and then steps through the $PICODE_i$. PICAL 170 generates a corresponding $PIOFFSET_i$ for each $PICODE_i$ and stores it in a corresponding location of PIRAM 914. Similarly, PICAL 170 may dynamically update particular $PIOFFSET_i$ values during an interval of steady-state operation of PLL 100 in response to an access of a particular $PICODE_i$.

During an acquisition interval or steady-state operation, PICAL 170 may compute each value of $PIOFFSET_i$ that is stored in PIRAM 914 using a low-pass filtering algorithm, e.g., $PIOFFSET_i[n+1]=PIOFFSET_i[n]+\mu_1 \times err$, where $0<i<N-1$, err is a version of the LATE signal and $\mu_1$ is a predetermined step size. PICODE is delayed by additional $n_1$ DIVCLK clock cycles (e.g., as illustrated by $z^{-n}{}_1$) and used to write back an updated value, PIOFFSETNEW, to the location in PIRAM 914 associated with PICODE. Note that the number of DIVCLK clock cycles of pipeline delay may vary. In at least one embodiment of PICAL 170, PIOFFSETNEW is based on a current error signal. For example, LATE indicates the phase error resulting from gain error and/or non-linearity of PIOFFSET and/or changes in runtime conditions, e.g., changes due to temperature drift. For example, addition/saturation unit 912 generates next value $PIOFFSET_i[n+1]$ (i.e., PIOFFSETNEW) by incrementing or decrementing a version of $PIOFFSET_i$ for a $PICODE_i$ by a predetermined amount DELTA, based on the error signal. Addition/saturation unit 912 limits the sum to a value between a minimum offset value and a maximum offset value. The version of the $PIOFFSET_i$ (e.g., PIOFFSET_D) used to generate an updated $PIOFFSET_i$ may be a delayed version of PIOFFSET read from PIRAM 914 corresponding to a PICODE (e.g., PICODE_D). PICODE_D and PIOFFSET_D are versions of PICODE and PIOFFSET, respectively, delayed by $n_1$ and $n_2$ DIVCLK clock cycles, respectively, to account for pipeline delays in the calibration loop. In at least one embodiment, the predetermined step size is variable and may be adjusted using a gear-shifting technique, as described further below. The output of addition/saturation unit 912, PIOFFSETNEW, is stored back to PIRAM 914 in a location associated with the corresponding PICODE.

Still referring to FIG. 6, in at least one embodiment of PICAL 170, the predetermined amount DELTA is variable and based on step size $\mu_1$. Gear shift 910 adjusts step size $\mu_1$. The gear-shifting technique can reduce calibration time by changing the step size $\mu_1$ to adjust the magnitude of DELTA during a calibration acquisition interval after a reset event, e.g., power-on-reset. For example, in response to power-on-reset, control logic sets DELTA to an initial value and gear shift 910 monotonically adjusts $\mu_1$ and DELTA (i.e., decreases the offset value) to transition from a coarser acquisition interval to a finer acquisition interval. Gear shift 910 may also adjust other parameters of PLL 100 as time progresses from power-on-reset. A phase/frequency detector offset calibration step size may be adjusted according to $\mu_2$ (discussed further below), a phase interpolator calibration step size may be adjusted according to $\mu_1$, and a phase/frequency detector offset DAC bandwidth and the amount of time spent in a particular gear for a particular clock frequency may be adjusted as well. Gear-shifting parameters may be selected to have final parameter settings that adjust PLL 100 to a particular temperature slope and to have a particular group delay (e.g., 2 C/sec and 750 nsec for 200 kHz PFD offset DAC filter bandwidth).

Figure 7:
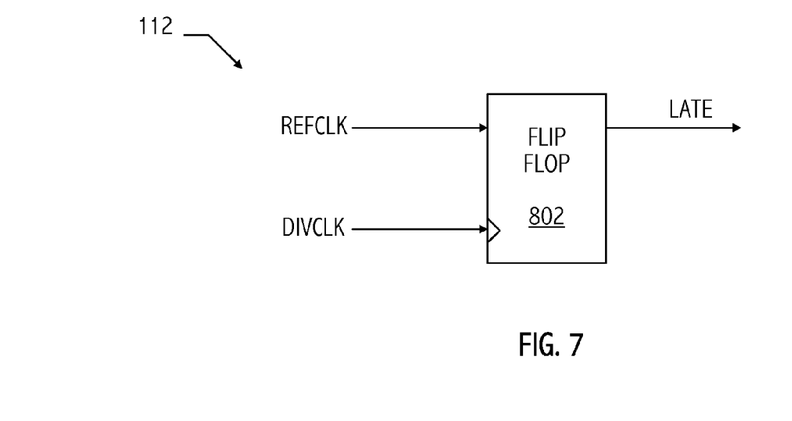
FIG. 7 illustrates a functional block diagram of phase detector circuitry configured to generate an error signal consistent with at least one embodiment of the invention.

The performance of the calibration technique depends on the quality of the error signal, LATE, which may be affected by the offset of the phase/frequency detector 112. Referring to FIG. 7, an exemplary circuit included in phase/frequency detector 112 generates the LATE signal using flip-flop 802, which receives REFCLK on a data node and is controlled by DIVCLK. Flip-flop 802 generates the LATE signal based on the value of DIVCLK at a rising edge of REFCLK. Note that in other embodiments of phase/frequency detector 112, flip-flop 802 is a falling edge-triggered flip-flop, is controlled by the DIVCLK, generates a LATE signal having a different polarity, or generates the LATE signal using other techniques to provide relative phase information for two clock signals. In other embodiments of interpolative divider 120, rather than receive the error signal from phase/frequency detector 112, equipment external to the clock synthesizer PLL determines the phase interpolator nonlinearity (e.g., by externally measuring delays associated with each PICODE) and provides the error signal to interpolative divider 120 using any suitable technique.

Referring back to FIG. 6, phase/frequency detector 112 provides loop filter 114 with the detected difference between REFCLK and DIVCLK. In at least one embodiment, phase/frequency detector 112 uses digital circuitry to detect the difference and converts the difference into an analog current using a charge pump. However, the phase/frequency detector 112 may introduce a current offset that can affect the integrity of the LATE signal. If left uncorrected prior to phase interpolator offset acquisition, the charge pump current offset may corrupt the LATE signal (e.g., the late signal receives a constant value) and may corrupt the PIOFFSET values and calibration of phase interpolator 122.

In at least one embodiment, PICAL 170 generates an indicator of that phase/frequency detector offset, PFDOSCODE, based on the error signal, LATE. Phase-locked loop 100 uses PFDOSCODE to compensate for the offset introduced by the phase/frequency detector 112. In at least one embodiment, OSCAL 906 computes PFDOSCODE using a low-pass filtering algorithm, e.g., $PFDOSCODE[n+1]=PFDOSCODE[n]+\mu_2 \times err$, where err is a version of the LATE signal, and $\mu_2$ is a step size. The step size may be gear-shifted to speed up the calibration technique at power-on-reset. The step sizes may be based on temperature change rates. Offset DAC 904 converts the PFDOSCODE into a current that is combined with (e.g., subtracted from) the output current generated by a charge pump coupled to the phase detector of phase/frequency detector 112 to compensate for the offset introduced by phase/frequency detector 112. PFDOSCODE may have high resolution and DAC 904 may convert the PFDOSCODE to a lower resolution signal, e.g., by using a sigma-delta modulator, before converting it into the current, PFDOFFSET. In at least one embodiment, DAC 904 includes a sigma-delta DAC followed by a continuous-time low-pass filter having a group delay that is short enough to prevent interference with phase interpolator calibration and having a bandwidth that is sufficient to support PFD offset calibration step size $\mu_2$.

Acquisition of PIOFFSET results in a PIOFFSET curve that has positive and negative offsets with respect to a target linear PIOFFSET curve for a range of values that span a delay of only a few percent of the period of a VCO clock cycle. The mean value of PIOFFSET over the entire range of PICODEs should be zero $$\left(\text{i.e.,} \left(\frac{1}{N}\sum_{i=0}^{N-1} PIOFFSET_i\right) = 0\right).$$

During a dynamic update interval, if PICAL 170 adjusts an individual $PIOFFSET_i$ without a corresponding equal and opposite adjustment of $PIOFFSET_j$ corresponding to another PICODE, the resulting PIOFFSETs will no longer have a mean value of zero over the entire range of PICODEs. If left uncorrected, the PIOFFSET values could increase and both the PFDOSCODE and the PIOFFSET could clip or otherwise go out of range. Note that the offset range is determined by the size of PIRAM 914 and the number of bits of PIOFFSET. Accordingly, a re-centering technique tracks updates to the PIOFFSET values and introduces a delay that gradually re-centers the PIOFFSET curve. The PFDOSCODE and hardware used to implement the phase/frequency detector offset, PFDOFFSET, may also be used to re-center the PIOFFSET curve. However, in other embodiments of 160, two separate codes are used and separate hardware may also be used.

The re-centering technique includes maintaining a total running sum of the PIOFFSET values that are stored in PIRAM 914. The total running sum may be computed by summing over time the adjustments made to any $PIOFFSET_i$. For example, ADJUST, which is the adjustment made to PIOFFSET_D by addition/saturation unit 912, is isolated by subtracting PIOFFSET_D from the output of addition/saturation unit 912 by using summer 911. Other techniques for providing the value of the adjustment to accumulator 908 may be used. Accumulator 908 provides the running sum value to logic 909. Logic 909 determines a DC adjustment value. Ideally, the output of accumulator 908 is zero. When an adjustment is made to $PIOFFSET_i$, the sum of contents of PIRAM 914 becomes non-zero, and similarly, the output of accumulator 908 deviates from zero. Logic 909 generates an adjustment value to slowly compensate for the non-zero sum of PIOFFSETs. For example, logic 909 provides an indication of whether the offset was increased or decreased by an incremental amount. Logic 909 provides that indication to offset calibration module 906. Offset calibration module 906 adds a corresponding adjustment value to the phase/frequency detector offset compensation value based on the LATE signal, thereby generating a phase/frequency detector offset compensation code used to adjust the output of phase/frequency detector 112, as described above. Use of PFD offset DAC code to reduce or eliminate DC offset in the PIOFFSET curve reduces interference between PFD offset calibration and phase interpolator calibration.

As a result of pipeline delay, the re-centering technique could corrupt $PIOFFSET_i$ if an offset is accumulated but rendered inconsequential by another offset that overwrites that $PIOFFSET_i$ within the pipeline delay interval. Accordingly, in at least one embodiment, the re-centering technique tracks whether a $PIOFFSET_i$ is accessed multiple times within an interval of the pipeline delay. For example, PICAL 170 includes a counter for each $PICODE_i$ to track the number of times each $PIOFFSET_i$ is accessed within the pipeline delay interval. The counter may start at the maximum number of DIVCLK clock cycles of pipeline delay, may be reset to zero when $PICODE_i$ is accessed, and may increment for each DIVCLK clock cycle. If a next access to $PICODE_i$ occurs before the counter reaches the maximum number of DIVCLK clock cycles, then the later access of $PICODE_i$ is ignored (i.e., $PIOFFSET_j$ is not computed and/or a corresponding location in PIRAM 914 is not updated with PIOFFSETNEW for that later access).

In at least one embodiment, PLL 100 calibrates the phase interpolator in multiple stages. An exemplary two-stage calibration includes an acquisition stage and a tracking stage. Before phase interpolator offset acquisition, PLL 100 acquires a value for PFDOFFSET. Otherwise, the LATE signal may be stuck at a constant value and may corrupt the phase interpolator calibration. Phase-locked loop 100 quickly acquires a calibration result for all $PICODE_i$ using a programmed divider ratio after PLL 100 has settled from a chip reset. In an exemplary embodiment, P (e.g., 256) parallel and independent calibration loops are needed, one for each $PICODE_i$ to produce each corresponding $PIOFFSET_i$. In each DIVCLK cycle, only the $PICODE_i$ in use is calibrated.

Figure 8:
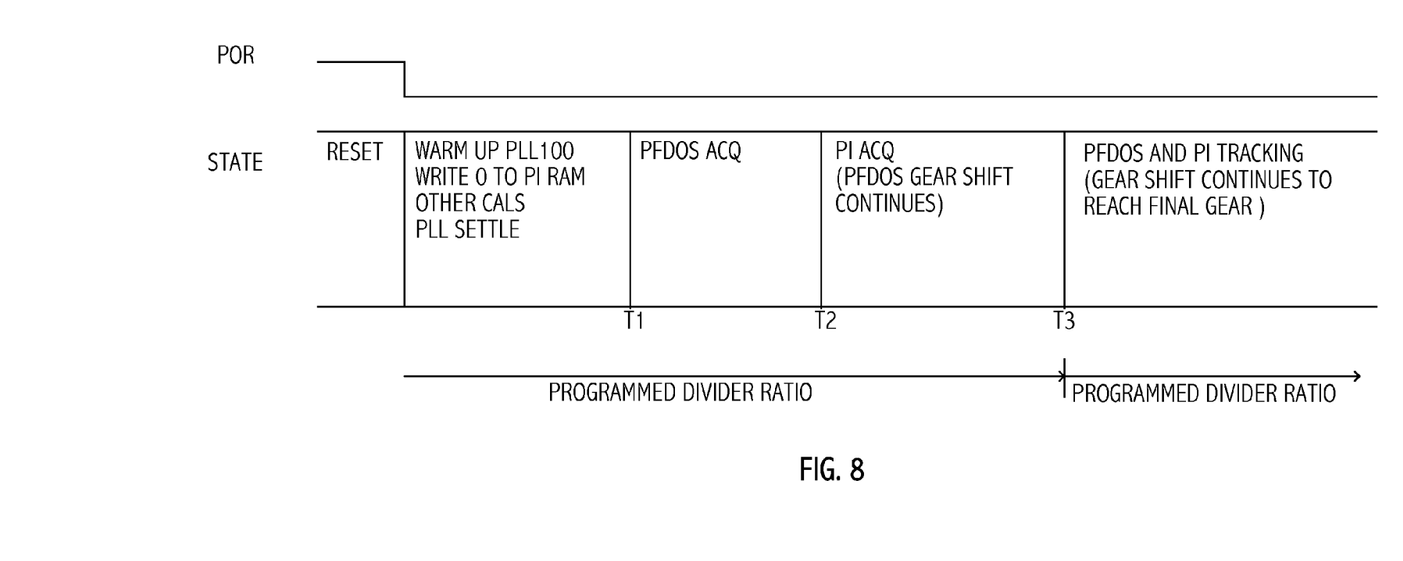
FIG. 8 illustrates an exemplary state diagram for calibration module 120 consistent with at least one embodiment of the invention.

Referring to FIGS. 5 and 8, a state machine (e.g., control module 173 of FIG. 5), which may be implemented using a general purpose processor executing instructions stored in storage device 175 or by custom-designed circuit logic, receives an indicator of power-on-reset, or other reset, and enables circuitry associated with PLL 100 to warm up. The state machine initializes PIRAM 914 with predetermined values (e.g., clears PIRAM 914 by writing zeros to the memory locations) and initializes any other predetermined values, e.g., sets DIVRATIO to a predetermined value from storage device 175. After expiration of the predetermined time interval, at time T1, the state machine initiates acquisition of PFDOSCODE using a first value of DELTA, which allows acquisition of a value of PFDOSCODE that results in a LATE signal that can be used during later PIOFFSET acquisition. After expiration of a second predetermined time interval, at time T2, the state machine initiates acquisition of PIOFFSET. Meanwhile, gear shifting of PFDOSCODE continues. Interpolative divider 120 acquires an initial offset value corresponding to each $PIOFFSET_i$ and stores those initial offset values in PIRAM 914.

After expiration of a third predetermined time interval, at time T3, the state machine transitions to a tracking mode that may include gear shifting of PIOFFSET and PFDOSCODE and that performs dynamic updates of PFDOSCODE and PIOFFSET values. During this interval, any gear shifting reaches a final increment size and the dynamic calibration tracks small variations in PFDOSCODE and PIOFFSET over time. In addition, the predetermined divider ratio may be replaced with a DIVRATIO for a particular application. However, the DIVRATIO for the target application may be the same as the predetermined DIVRATIO used during acquisition. Note that T1, T2, and T3 may be programmable.

Figure 9:
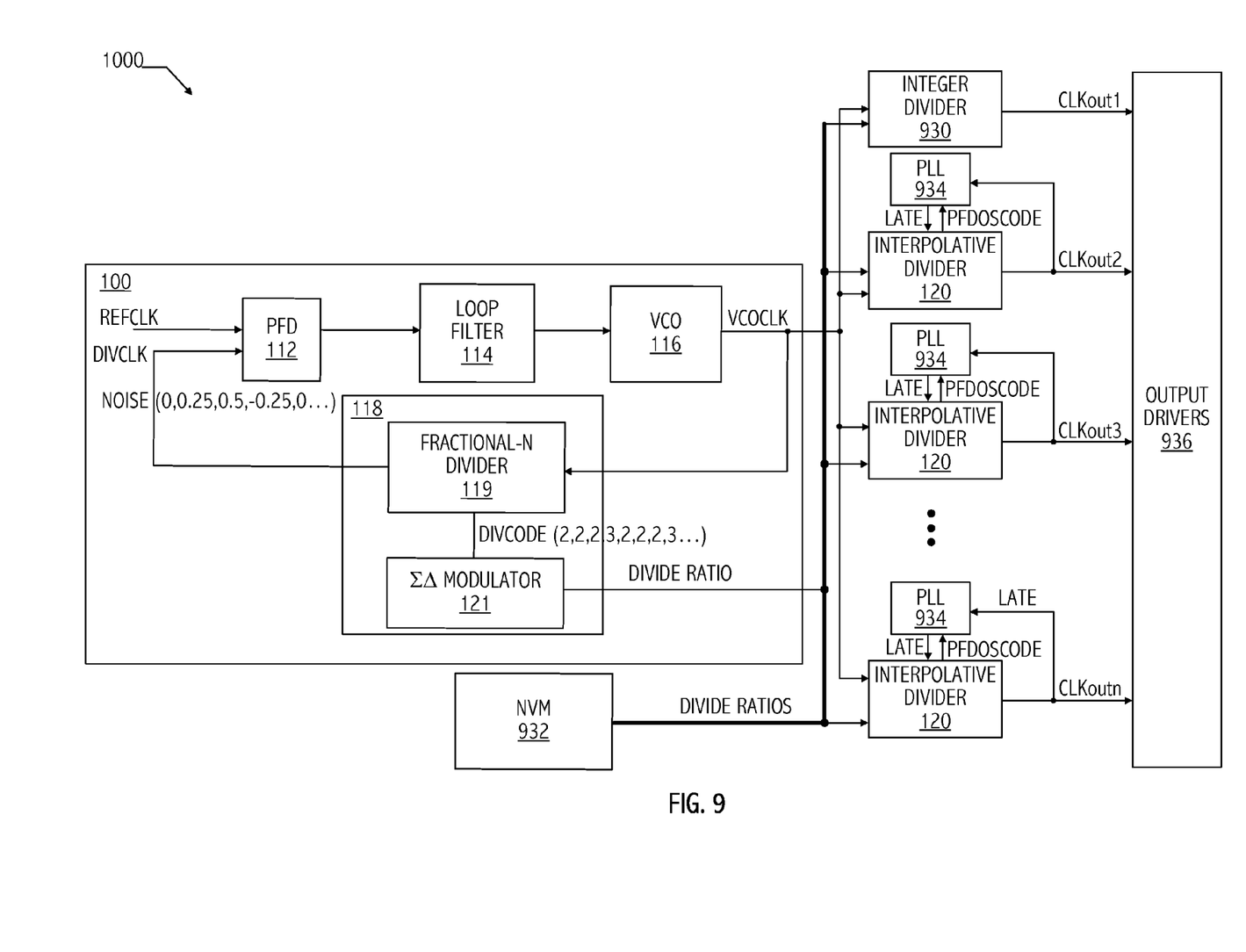
FIG. 9 illustrates a functional block diagram of an interpolative clock synthesizer incorporating multiple interpolative dividers to generate multiple independent output clock signals consistent with at least one embodiment of the invention.

Referring to FIG. 9, an exemplary interpolative clock synthesizer 1000 includes PLL 100, which includes phase/frequency detector 112, a loop filter 114, and VCO 116. Phase-locked loop 100 includes a divider, which may be divider 118 or interpolative divider 120, both of which are described above. A storage device, non-volatile memory 932 supplies a divide ratio to the divider 118. In addition, clock synthesizer 1000 includes one or more interpolative dividers 120 that generate clock signals based on the output of VCO 116 (VCOCLK) and a corresponding fractional divider value received from NVM 932. An integer divider 930 may also be included and receive a divide value from NVM 932. Interpolative dividers 120 provide output clock signals CLKOUT2, CLKOUT3, . . . , CLKOUTn to output drivers 936. The calibration techniques described above are adapted to calibrate interpolative dividers 120, which are coupled to an output of PLL 100 (i.e., configured as "output interpolative dividers") rather than coupled in the feedback path of PLL 100 (i.e., "feedback interpolative dividers"), as described above with regard to FIGS. 5-8.

Figure 10:
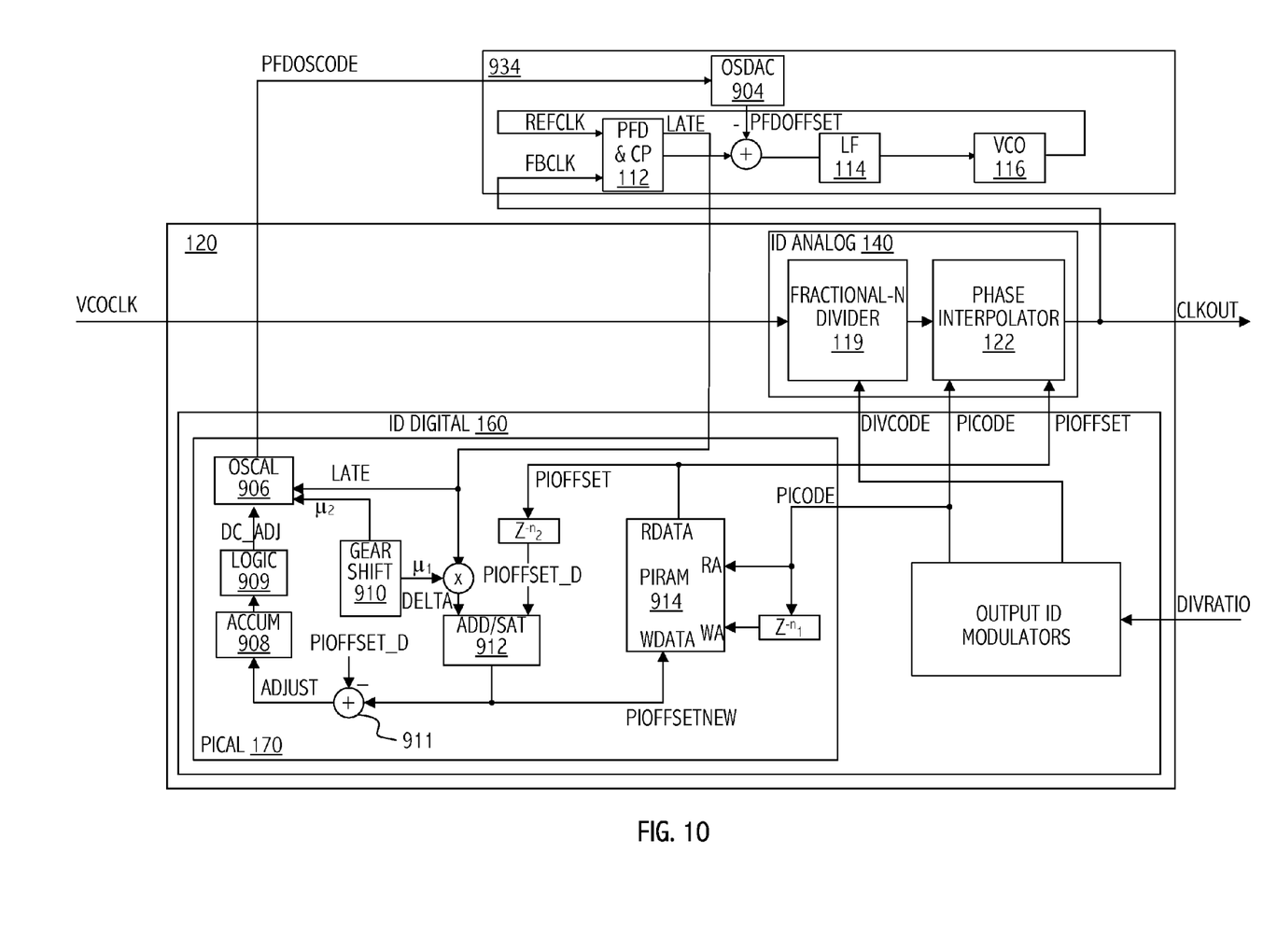
FIG. 10 illustrates a detailed, functional block diagram of portions of the interpolative clock synthesizer of FIG. 9 consistent with at least one embodiment of the invention.

Referring back to FIG. 9, in order to calibrate a particular output interpolative divider 120, clock synthesizer 1000 includes additional circuitry to provide a corresponding error signal, LATE. For example, each output interpolative divider 120 receives a corresponding LATE signal from a corresponding PLL 934, which receives a respective interpolative divider output clock signal, CLKOUT (e.g., CLKOUT2, CLKOUT3, . . . , or CLKOUTN) as a reference clock signal. FIG. 10 illustrates an individual interpolative divider 120 configured as an output interpolative divider for phase interpolator calibration based on a LATE signal received from a corresponding PLL 934. Interpolative divider 120 generates the PICODE and generates the PIOFFSET corresponding to the PICODE based on that LATE signal. However, interpolative divider 120 generates CLKOUT based on a clock signal, VCOCLK, received from PLL 100 of FIG. 9. Referring back to FIG. 10, output interpolative divider 120 provides offset signal, PFDOSCODE, to PLL 934, which combines a corresponding PFDOFFSET with the output of phase/frequency detector 112 in PLL 934, as described above with reference to FIG. 6. In some embodiments of clock synthesizer 1000, PLLs 934 are not included and PLL 100 of clock synthesizer 1000 may be used to calibrate each output interpolative divider 120 by selectively replacing feedback divider 118 with an individual output interpolative divider 120 and generating the LATE signal in PFD 112. In other embodiments of clock synthesizer 1000, rather than generate error signals in PLLs 934, equipment external to clock synthesizer 1000 determines the phase interpolator nonlinearity for each interpolative divider 120 and provides a corresponding error signal to each interpolative divider 120 using any suitable technique.

For typical divider ratios, the phase interpolator calibration techniques described above may result in one or more spurs having power levels greater than a specified power level. The power level of those spurs may decrease over time from power-on-reset or other event. However, a particular divider ratio may result in one or more spurs having power levels greater than the specified power level, but the power levels of those spurs do not decrease over time using the phase interpolator offset calibration. Accordingly, a clock synthesizer application may be designed to use only those divider ratios that achieve the target performance using the phase interpolator offset calibration. For those applications that use a divide ratio for which the phase interpolator offset signal calibration is insufficient to achieve the target performance, an alternate phase interpolator calibration technique may be used.

Figure 11:
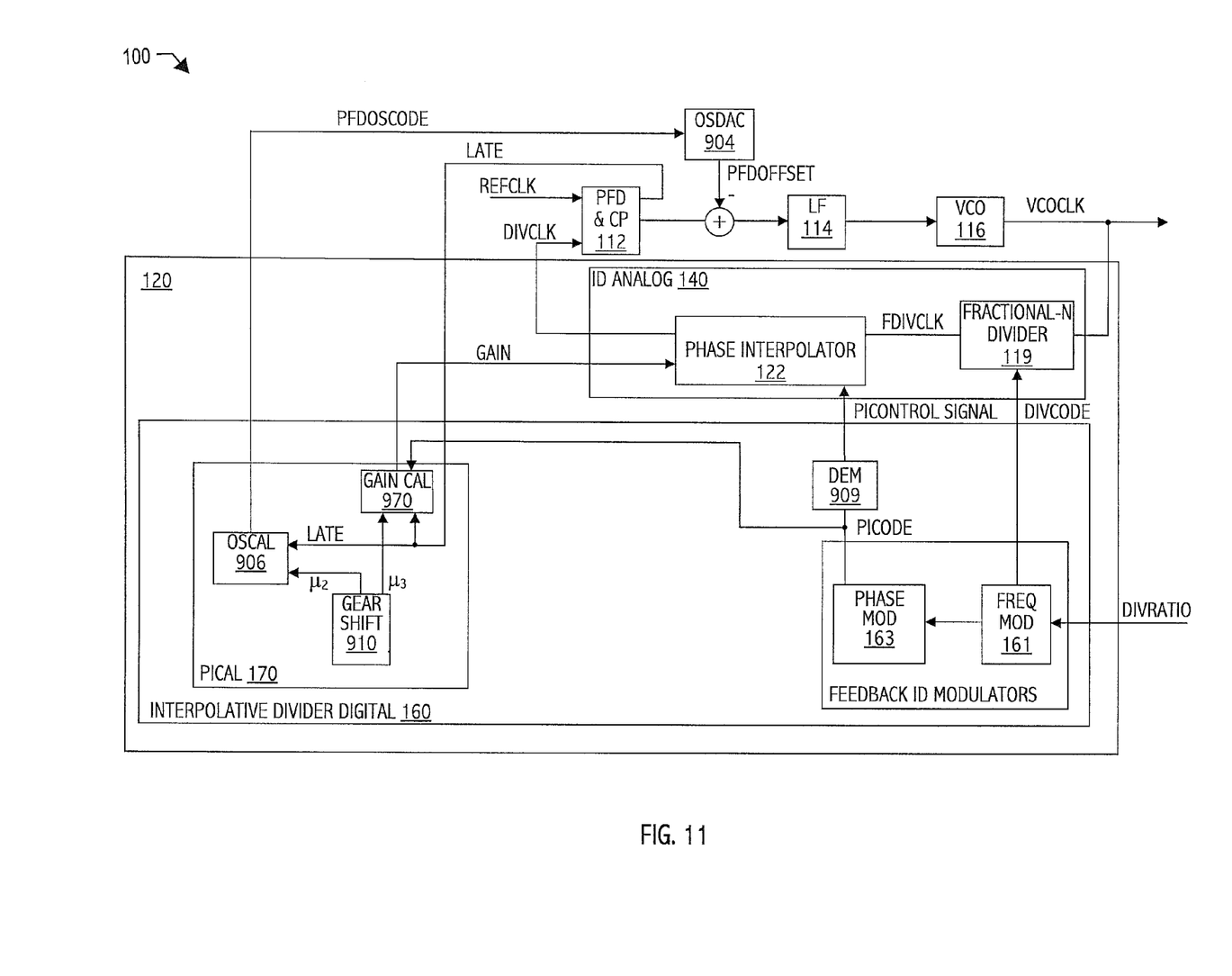
FIG. 11 illustrates a detailed, functional block diagram of portions of the PLL of FIG. 5, including an interpolative divider with a calibration module configured to generate a phase interpolator gain code consistent with at least one embodiment of the invention.

Referring to FIG. 11, rather than use a phase interpolator offset signal to calibrate the interpolative divider to reduce spur power and increase the performance of a clock synthesizer, phase interpolator calibration circuitry 170 generates a phase interpolator calibration signal that indicates a gain to be applied to generation of a phase interpolated signal by phase interpolator 122. Phase interpolator 122 may apply this gain as a scaling factor to the phase interpolator delay corresponding to the PICODE. Phase interpolator calibration circuitry 170 determines a single gain code that is applicable to any PICODE. The gain code may be determined during power-up interval after the PLL has settled and an associated PFDOSCODE has been calibrated to obtain a useful LATE signal. The gain code may also be adjusted dynamically in the background to account for variations resulting from environmental factors (e.g., temperature variations). That gain code is used to adjust the delay corresponding to any value of the PICODE. Using this calibration technique, the total delay introduced by phase interpolator 122 is GAIN×DELAY(PICODE). The total delay may be implemented in phase interpolator 122 using any suitable technique.

Gain calibration module 970 may generate the value of GAIN based on the PICODE and LATE. For example, if the PICODE is greater than or equal to a predetermined level and if the LATE signal indicates that DIVCLK is earlier than REFCLK, then gain calibration module 970 increases GAIN by a predetermined step size and otherwise decreases GAIN by the predetermined step size. If the PICODE is less than the predetermined level and if the LATE signal indicates that DIVCLK is later than REFCLK, then gain calibration module 970 increases GAIN by the predetermined step size and otherwise decreases GAIN by the predetermined step size. The predetermined level may be the mid-point of the PICODE range. In other embodiments, multiple predetermined levels are used, e.g., two levels equidistant from the midpoint of the PICODE range, or four levels including pairs of levels equidistant from the midpoint of the PICODE range. Different PICODE ranges may use different step sizes to increase or decrease the gain. For example, PICODE ranges nearest to the midpoint of the PICODE range may use smaller step sizes than those ranges farther from the midpoint. However, other suitable algorithms may be used. The gain calibration is performed using a predetermined divide ratio after power-on-reset and after PFDOS acquisition. The gain calibration may also be performed dynamically in the background using the actual divide ratio. The gain calibration may be gear-shifted by changing parameter $\mu_3$, which is used to adjust the predetermined step size.

Figure 12C:
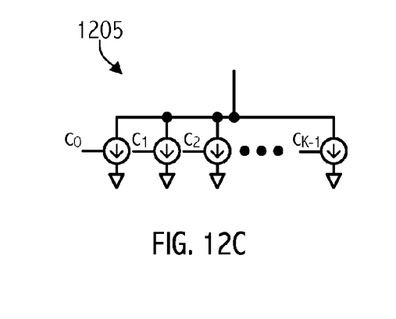
FIG. 12C illustrates an embodiment of a current source that may be used by the phase interpolator of FIG. 12A.

In at least one embodiment of the gain calibration technique, target performance is achieved by converting the phase interpolator code to an analog phase interpolator signal using a current DAC. In a typical DAC, element mismatches introduce an output error, which may include harmonics of the input signal. By implementing the DAC function from K unit elements (e.g., K equal-valued current sources in phase interpolator 122), dynamic-element-matching (DEM) techniques are implemented using digital control logic in DEM 909 to reduce the output error of the DAC. If the value of the PICODE is J, then DEM 909 controls the data conversion by activating J of the K unit elements. The digital control circuit DEM 909 chooses which K unit elements are activated in an order that reduces effects of element mismatch. For example, current sources 1205, 1207, 1209, and 1211 of phase interpolator 122 of FIG. 12A each include K unit elements, as illustrated in FIG. 12C. Assuming that the PICODE has R+Q bits and the first R bits are used to select current source pairs and the remaining Q bits are used to generate appropriate control signals, control signals $c_0, c_1, \ldots c_{K-1}$, for the current source, where K is equal to $2^Q$. DEM 909 converts those Q bits to a thermometer code that selectively turns on J of the K unit elements. DEM 909 selects which J of the K unit elements are turned on by rotating through the unit elements in a round-robin fashion, randomly, or using another suitable technique.

In at least one embodiment, a clock synthesizer implements both interpolative divider calibration techniques that generate a phase interpolator calibration signal. That is, phase interpolator calibration circuit 170 implements calibration techniques associated with generation of a PIOFFSET corresponding to a phase interpolator code calibration of FIGS. 6 and 10 and implements the calibration techniques associated with generation of a phase interpolator gain signal, GAIN. Each of those techniques may be implemented with or without dynamic element matching of FIG. 11. Control logic enables use of the phase interpolator offset calibration or phase interpolator gain calibration, each with or without dynamic element matching, based on a mode of operation received from a control module (e.g., control module 173 of FIG. 5). Control module 173 may select the mode of operation based on an input received from a user or target application. In general, the PIOFFSET calibration achieves greater phase interpolator linearity enhancement than the phase interpolator gain calibration. Accordingly, for those applications that require superior linearity, the control logic may configure the clock synthesizer system to use the PIOFFSET calibration technique and with only those divider ratios that will achieve target performance using the PIOFFSET calibration technique. For lower-performance applications, the control logic may configure the interpolative divider to use the PIOFFSET calibration technique or the phase interpolator gain calibration technique based on a DIVIDE RATIO target of the user or application. Control module 173 may configure the interpolative divider to implement a particular one of the calibration techniques based on contents of storage 175 or based on signals received from off-chip. Control module 173 and/or other structures described herein may be implemented using software executing on a processor (which includes firmware) or by a combination of software and hardware. Software, as described herein, may be encoded in at least one tangible computer-readable medium. Although the gain calibration and dynamic element matching techniques are described above with regard to an interpolative divider in a feedback path of a PLL, those techniques may be implemented in an output interpolative divider (e.g., interpolative divider 120 of FIGS. 9 and 10).

Thus, embodiments of a clock synthesizer and interpolative divider calibration techniques that reduce or eliminate spurs associated with phase interpolator have been described. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A method comprising:
generating a phase interpolator calibration signal to adjust a phase interpolator output signal generated by a phase interpolator of an interpolative divider, the phase interpolator being responsive to a phase interpolator control code and an output signal of a fractional-N divider of the interpolative divider, the phase interpolator calibration signal being based on an error signal indicative of phase interpolator error, the phase interpolator calibration signal being a phase interpolator offset code corresponding to the phase interpolator control code, the phase interpolator offset code being one of a plurality of phase interpolator offset codes; and
adjusting a mean value of the plurality of phase interpolator offset codes to equal zero.

2. The method, as recited in claim 1, further comprising:
generating the error signal based on a phase relationship between a reference clock signal and a feedback clock signal of a phase-locked loop (PLL).

3. The method, as recited in claim 2, wherein the interpolative divider is coupled in a feedback path of the PLL, the PLL receiving the reference clock signal and the feedback clock signal being an adjusted phase interpolator output signal.

4. The method, as recited in claim 2, wherein the PLL receives an adjusted phase interpolator output signal as the feedback clock signal and the reference clock signal is generated by a voltage controlled oscillator of the PLL.

5. The method, as recited in claim 1, wherein the phase interpolator offset code is based on a first phase interpolator offset step size, the method further comprising:
reducing the phase interpolator offset step size at a first predetermined time after power-on-reset.

6. The method, as recited in claim 2, further comprising:
providing to the PLL a phase detector offset signal based on the error signal.

7. The method, as recited in claim 6, further comprising:
adjusting a phase indicator signal according to the phase detector offset signal, the phase indicator signal being a current generated by a charge pump based on a phase difference between the reference clock signal and the feedback clock signal and provided to a loop filter of the PLL.

8. The method, as recited in claim 1, wherein the phase interpolator calibration signal is a phase interpolator gain signal.

9. The method, as recited in claim 1, wherein a phase interpolator control signal is generated based on dynamic element matching according to the phase interpolator control code.

10. The method, as recited in claim 1, further comprising:
configuring the phase interpolator calibration signal to be a phase interpolator gain signal or a phase interpolator offset signal corresponding to a phase interpolator control signal.

11. A method comprising:
generating a phase interpolator calibration signal to adjust a phase interpolator output signal generated by a phase interpolator of an interpolative divider, the phase interpolator being responsive to a phase interpolator control code and an output signal of a fractional-N divider of the interpolative divider, the phase interpolator calibration signal being based on an error signal indicative of phase interpolator error, the phase interpolator calibration signal being a phase interpolator offset code corresponding to the phase interpolator control code, the phase interpolator offset code being based on a first phase interpolator offset step size, and
reducing the phase interpolator offset step size at a first predetermined time after power-on-reset.

12. The method, as recited in claim 11, further comprising:
providing a stored phase interpolator offset code corresponding to the phase interpolator control code to the phase interpolator; and
storing the phase interpolator offset code as the stored phase interpolator offset code corresponding to the phase interpolator control code.

13. The method, as recited in claim 11, wherein the phase interpolator offset code is further based on a stored phase interpolator offset code corresponding to the phase interpolator control code.

14. The method, as recited in claim 11, wherein the phase interpolator offset code is one of a plurality of phase interpolator offset codes, the method further comprising:
adjusting a mean value of the plurality of phase interpolator offset codes to equal zero.

15. A method comprising:
generating a phase interpolator calibration signal to adjust a phase interpolator output signal generated by a phase interpolator of an interpolative divider, the phase interpolator being responsive to a phase interpolator control code and an output signal of a fractional-N divider of the interpolative divider, the phase interpolator calibration signal being based on an error signal indicative of phase interpolator error,
generating the error signal based on a phase relationship between a reference clock signal and a feedback clock signal of a phase-locked loop (PLL), and
providing to the PLL a phase detector offset signal based on the error signal,
wherein the phase detector offset signal is further based on an adjustment value applied to a stored phase interpolator offset corresponding to the phase interpolator code to generate the phase interpolator offset code.

16. A method comprising:
generating a phase interpolator calibration signal to adjust a phase interpolator output signal generated by a phase interpolator of an interpolative divider, the phase interpolator being responsive to a phase interpolator control code and an output signal of a fractional-N divider of the interpolative divider, the phase interpolator calibration signal being based on an error signal indicative of phase interpolator error,
generating the error signal based on a phase relationship between a reference clock signal and a feedback clock signal of a phase-locked loop (PLL), and
providing to the PLL a phase detector offset signal based on the error signal,
wherein the phase detector offset signal is further based on a first phase detector offset step size, the method further comprising:
reducing the phase detector offset step size at a first predetermined time after power-on-reset of the PLL.

17. An integrated circuit comprising:
an interpolative divider circuit configured to generate an adjusted clock signal based on a clock signal, a divider control signal, a phase interpolator control signal, and a phase interpolator calibration signal; and
a calibration circuit configured to generate the phase interpolator calibration signal based on an error signal indicative of phase interpolator error, the calibration circuit comprising a circuit configured to adjust a step size for generating an updated phase interpolator offset code at a predetermined time after power-on-reset of the integrated circuit.

18. The integrated circuit, as recited in claim 17, wherein the error signal indicates a phase relationship between a reference clock signal and a feedback signal of a phase-locked loop (PLL).

19. The integrated circuit, as recited in claim 17, wherein the phase interpolator calibration signal is one of a phase interpolator gain signal and a phase interpolator offset signal corresponding to the phase interpolator control signal.

20. The integrated circuit, as recited in claim 17, further comprising:
a dynamic element matching logic configured to generate the phase interpolator control signal based on a phase interpolator control code.

21. The integrated circuit, as recited in claim 17, further comprising:
a phase-locked loop (PLL), wherein the PLL comprises the interpolative divider circuit configured to generate the feedback signal of the PLL.

22. The integrated circuit, as recited in claim 17, further comprising:
a phase-locked loop (PLL) configured to provide the clock signal to the interpolative divider circuit, the interpolative divider circuit being coupled in an output path of a clock synthesizer circuit to generate the adjusted clock signal based on a first divider control value; and
an additional interpolative divider circuit coupled in an additional output path of the clock synthesizer circuit and configured to generate an additional adjusted clock signal based on the clock signal and a second divider control value.

23. The integrated circuit, as recited in claim 17, wherein the phase interpolator calibration signal is a phase interpolator offset code corresponding to the phase interpolator control signal.

24. The integrated circuit, as recited in claim 23, wherein the calibration circuit comprises:
a storage module configured to store a plurality of phase interpolator offsets corresponding to a plurality of respective phase interpolator codes.

25. The integrated circuit, as recited in claim 23, wherein the calibration circuit comprises:
a summing circuit configured to generate an updated phase interpolator offset code based on the phase interpolator offset code and the error signal.

26. The integrated circuit, as recited in claim 17, wherein the calibration circuit comprises:
phase detector offset generator configured to provide, to a PLL generating the error signal, a phase detector offset code based on the error signal.

27. The integrated circuit, as recited in claim 26, wherein the calibration circuit comprises:
a phase detector offset conversion circuit configured to convert the phase detector offset code into a signal for combination with an output of a charge pump of the PLL.

28. An integrated circuit comprising:
an interpolative divider circuit configured to generate an adjusted clock signal based on a clock signal, a divider control signal, a phase interpolator control signal, and a phase interpolator calibration signal; and
a calibration circuit configured to generate the phase interpolator calibration signal based on an error signal indicative of phase interpolator error, the calibration circuit comprising:
phase detector offset generator configured to provide, to a PLL generating the error signal, a phase detector offset code based on the error signal; and
adjustment logic configured to provide to the phase detector offset generator, a phase detector adjustment to adjust a mean value of a plurality of phase interpolator offset codes, the phase detector adjustment being based on accumulated offsets used to generate updated phase interpolator offsets corresponding to respective phase interpolator codes.

29. The integrated circuit, as recited in claim 28, wherein the calibration circuit further comprises:
a circuit configured to adjust a step size for generating an updated phase interpolator offset code at a predetermined time after power-on-reset of the integrated circuit.

* * * * *